United States Patent [19]

Bujanos

[11] Patent Number: 5,572,664
[45] Date of Patent: Nov. 5, 1996

[54] SYSTEM FOR GENERATING FLOATING POINT TEST VECTORS

[75] Inventor: Norman Bujanos, Austin, Tex.

[73] Assignee: Advanced Micro Devices, Inc., Sunnyvale, Calif.

[21] Appl. No.: 563,140

[22] Filed: Nov. 27, 1995

Related U.S. Application Data

[63] Continuation of Ser. No. 252,026, Jun. 1, 1994, abandoned.

[51] Int. Cl.[6] .................................................. G01R 31/28
[52] U.S. Cl. .............................. 395/183.01; 395/183.04; 395/183.17
[58] Field of Search .................... 395/183.01, 183.04, 395/183.17

[56] References Cited

U.S. PATENT DOCUMENTS

| | | | |
|---|---|---|---|
| 4,858,105 | 8/1989 | Kuriyama et al. | 364/200 |
| 5,053,631 | 10/1991 | Perlman et al. | 364/748 |
| 5,058,048 | 10/1991 | Gupta et al. | 364/748 |
| 5,128,888 | 7/1992 | Tamura et al. | 364/748 |
| 5,128,891 | 7/1992 | Lynch et al. | 364/767 |
| 5,226,126 | 7/1993 | McFarland et al. | 395/375 |
| 5,237,700 | 8/1993 | Johnson et al. | 395/775 |
| 5,251,306 | 10/1993 | Tran | 395/375 |

FOREIGN PATENT DOCUMENTS

| | | | |
|---|---|---|---|
| 0111952 | 6/1984 | European Pat. Off. | G06F 11/26 |

OTHER PUBLICATIONS

*Advanced Microprocessors* by Daniel Tabak ©1991 by McGraw–Hill, Inc. pp. 42, 61–74 and 185–189.
PC Magazine, Feb. 1995 p. 32.
Brian Case, "AMD Unveils First Superscalar 29K Core", *Microprocessor Report*, Oct. 24, 1994, pp. 23–26.
Michael Slater, "AMD's K5 Designed to Outrun Pentium", *Microprocessor Report*, Oct. 24, 1994, pp. 1, 6–11.
C. Bellon, et al., *Analysis of Experimental Results on Functional Testing and Diagnosis of Complex Circuits*, 1988 International Test Conference, Sep., 1988, pp. 64–72.
A. Aharon, et al., *Verification of the IBM RISC System/6000 by a Dynamic Biased Pseudo–random Test Program Generator*, IBM Systems Journals, vol. 30, No. 4, 1991, pp. 527–538.
March Marshall, *Techniques for User Testing of the 68882*, 1988 International Test Conference, Sep., 1988, pp. 942–947.
Electronic Engineering, *A Successful Design Methodology for x86 Processors*, Sep., 1993, pp. S39–S41.
Floating–Point Working Group of the Microprocessor Standards Subcommittee, ANSI/IEEE, Std 754–1985, "IEEE Standard for Binary Floating–Point Arithmetic"; 1985; pp. 7–17.
University of California at Berkeley, College of Engineering, Department of Electrical Engineering and Computer Sciences, Industrial Liaison Program, "A Compact Test Suite for P754 Arithmetic—Version 2.0)", pp. 1–7).

*Primary Examiner*—Vincent P. Canney
*Attorney, Agent, or Firm*—Skjerven, Morrill, MacPherson, Franklin & Friel

[57] ABSTRACT

A test-vector generating system (200) controls a processor (110) having a paradigm floating point functional unit (160) which executes a paradigm floating point instruction set. The system includes computer program modules including an interactive test selection process (202) in which a test instruction is selected from the paradigm instruction set, an operand data generation process (222), a test instruction execution process (226) in which the paradigm functional unit executes the test instruction operating upon the generated operand data and a test vector result recording process (208) in which a test vector result of the test instruction execution is recorded.

45 Claims, 9 Drawing Sheets

SYSTEM FOR GENERATING FLOATING POINT TEST VECTORS

This application is a continuation of application Ser. No. 08/252,026, filed Jun. 1, 1994, now abandoned.

BACKGROUND OF THE INVENTION

1. Field of the Invention

The present invention relates to a system for generating test vectors which test the computational and operational functionality of a processor and, more particularly, to a system that generates floating point arithmetic test vectors.

2. Description of the Related Art

Many microprocessors have a floating point hardware capability. This capability is furnished by an implementation of various numerical algorithms that act on numbers configured in various floating point formats. Floating point processors attempt to approximate, as accurately as possible, the system of real numbers which is conceptually infinite and continuous. There is no upper limit or lower limit to the magnitude of real numbers. For any two real numbers a real number exists that has a magnitude intermediate to the two numbers.

A perfect computer would be able to operate on the entire real number system. However, this is not possible. Computers, regardless of size or power, ultimately operate on fixed-size data elements that limit the system of numbers that can be accommodated. Computer arithmetic on real numbers is inherently approximate. The floating point formats, numerical algorithms and implementations of floating point algorithms of different computer systems vary greatly so that the results of floating point operations also deviate, sometimes in a surprising fashion. In many instances, floating point algorithms and implementations for computer systems have been selected on the basis of speed performance, rather than accuracy.

A standard, known as IEEE/ANSI Standard 754/1985, and a later generalized IEEE Standard 854, have been established to define a floating point arithmetic implementation. These are important standards as nearly all microprocessor implementations of floating point arithmetic claim compatibility. The IEEE standard specifies the detailed binary formats of floating point numbers and defines the exact results to be obtained as a result of arithmetic operations. However, a floating point arithmetic implementation cannot possibly give the mathematically correct results in all cases because some numbers cannot be represented with infinite precision. Thus, although the IEEE floating point arithmetic standard cannot guarantee that the results of a calculation are precisely correct, it does expect that the results will be the same for different microprocessor floating point arithmetic implementations.

Software developers, users of software programs and others find it advantageous that the IEEE standard is established. However, computer designers are now faced with the task of verifying their arithmetic implementations for all operations performed on all numbers. The quantity of true real numbers is infinite. The quantity of different floating point numbers that can be represented in a processor is virtually infinite. Every test of every number and combination of numbers which is performed in the verification of an arithmetic implementation requires a discrete amount of time. Therefore, it is impossible to test an arithmetic implementation for every operation of every combination of numbers.

This task is commonly addressed by testing the results generated by a floating point implementation of a microprocessor against the results of a benchmark test suite of floating point operations and operand data. One such test suite is furnished in "A Compact Test Suite for P754 Arithmetic—Version 2.0" University of California at Berkeley, College of Engineering, Department of Electrical Engineering and Computer Sciences, Industrial Liaison Program.

In many instances a microprocessor is included in a family of microprocessors which have evolved over time to incorporate technological advances. It is commonly intended that arithmetic operations of the family of microprocessors maintain software compatibility so that software that runs on one microprocessor in the family will function precisely the same when run on another microprocessor. Thus is raised a further problem of devising a test of a floating point arithmetic implementation that checks for precise duplication of the results of an existing microprocessor. This duplication of results applies not only to numerical results of calculations but also pertains to condition codes and exception and trap signals that are generated under various conditions.

SUMMARY OF THE INVENTION

It is advantageous to furnish a system which generates test vectors for testing compliance of a floating point arithmetic implementation with the IEEE/ANSI Standard 754/1985 and the IEEE Standard 854.

It is advantageous to furnish a system which generates test vectors for testing a floating point arithmetic implementation in which the vectors are generated from calculations based on operand data that include a combination of randomly selected data, special test case data, standard benchmark data and boundary condition data.

It is advantageous to furnish a system which generates test vectors for testing equivalence of the functionality of a floating point arithmetic implementation with the functionality of a paradigm floating point unit in which the vectors are generated from calculations executed on a microprocessor utilizing a paradigm floating point unit.

It is advantageous to furnish a system which generates test vectors for testing equivalence of the functionality of a floating point arithmetic implementation with the functionality of a paradigm floating point unit in which the vectors are generated from calculations executed on a microprocessor utilizing a paradigm floating point unit and the functional tests include tests of condition code, exception and trap behavior as well as computational accuracy.

In accordance with a first embodiment, there is described a method of generating a test vector by executing a plurality of program instructions on a processor which includes a paradigm functional unit. The program instructions include a plurality of instructions in a paradigm instruction set which are executed by the paradigm functional unit. The method includes the steps of selecting a test instruction of the paradigm instruction set, generating operand data which is operated upon by the paradigm functional unit as it executes the test instruction, executing the test instruction as it operates upon the generated data and recording a test vector result of the test instruction execution. The method may be applied to a floating point instruction set executing on a floating point paradigm functional unit.

In accordance with a second embodiment, there is described a computer program test-vector generating system for controlling a processor having a paradigm functional unit which executes a paradigm instruction set. The system includes an arrangement of instructions formed into a plurality of modules including an interactive test selection process in which a test instruction is selected from the paradigm instruction set, an operand data generation process, a test instruction execution process in which the paradigm functional unit executes the test instruction operating upon the generated operand data and a test vector result recording process in which a test vector result of the test instruction execution is recorded. The system may be applied to a floating point instruction set executing on a floating point paradigm functional unit.

BRIEF DESCRIPTION OF THE DRAWINGS

The present invention may be better understood and its advantages, objects and features made better apparent by making reference to the following description, taken in conjunction with the accompanying drawings, in which like reference numbers identify like elements, and wherein.

DETAILED DESCRIPTION OF THE PREFERRED EMBODIMENT

Figure 1:
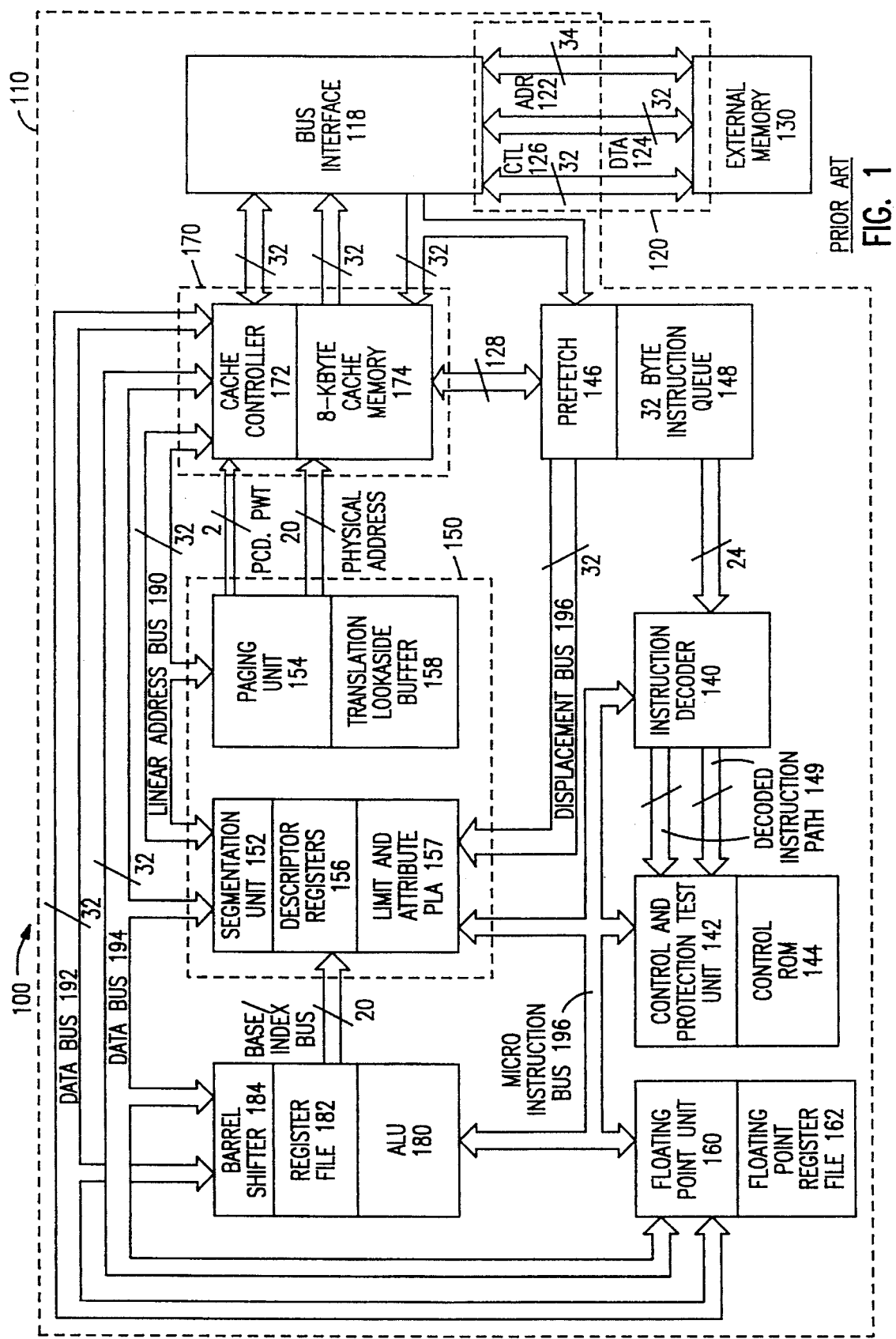
FIG. 1 is an architecture level block diagram of a microprocessor which is used to generate test vectors for testing functional and operational equivalence of a design functional unit to a functional unit of the microprocessor.

Referring to FIG. 1, a computer system 100 includes a microprocessor 110 and a memory 130. Computer system 100 also has conventional components including an input device such as a keyboard, a display such as a monitor, a magnetic disk drive and communication lines such as serial lines and parallel lines, none of which are shown.

In a preferred embodiment, the microprocessor 110 is an i486 Microprocessor, available from Intel Corporation of Santa Clara, Calif. The 486 microprocessor 110 is a 32-bit microprocessor, which includes a memory management unit 150, a floating point unit 160 and a cache memory unit 170 all on a singlechip. A bus interface 118 connects microprocessor 110 to an external memory 130 via an external bus 120 to receive program instructions and transfer data. External bus 120 includes address lines 122, data lines 124 and control lines 126.

Microprocessor 110 is controlled to receive program instructions either via cache memory unit 170 or directly from bus interface 118. A prefetch circuit 146 is connected to cache memory unit 170 and to the bus interface 118 to receive the instructions. Prefetch circuit 146 is connected to a 32-byte instruction queue 148, which temporarily stores the prefetched instructions before the instructions are decoded and executed. An instruction decoder 140 is connected to instruction queue 148 to access the queued instructions. Instruction decoder 140 decodes the instructions and communicates the decoded instructions to a control and protection test unit 142 and control ROM 144, which are interconnected, via a decoded instruction path 149. Microinstructions are communicated to various functional units for execution over microinstruction lines 198. Specifically, microinstructions lines 198 connect instruction decoder 140, interconnected control and protection test unit 142 and control ROM 144, memory management unit 150, an ALU 180, a register file 182, a barrel shifter 184 and floating point unit 160. ALU 180, register file 182 and barrel shifter 184 are interconnected.

Floating point unit 160, which operates in parallel with ALU 180, executes arithmetic instructions for both floating point and fixed point data. Floating pint unit 160 conforms to ANSI/IEEE standard 754-1985 for floating point arithmetic. Floating point unit 160 is connected to a floating point register file 162 to operate on data within the floating point register file 162.

Cache memory unit 170, which includes a cache controller 172 and an 8-kbyte cache memory 174, stores frequently used program instructions and data interior to the microprocessor chip 110 so that accesses of the external bus 120 are reduced.

Memory management unit 150 includes a segmentation unit 152 and a paging unit 154. The segmentation unit 152, which is interconnected with descriptor registers 156 and a limit and attribute PLA 157, is furnished for managing the logical address space of the external memory 130 so that data and instructions are easily relocated. Segmentation unit 152 organizes external memory 130 into one or more variable length segments. The character of a segment is determined according to attributes governed by segmentation unit 152, including location, size, type (stack, instruction or data) and protection attributes. Segmentation unit 152 selects between various levels of protection for isolating and protecting application programs and operating system functionality. Paging unit 154 is connected with a translation lookaside buffer 158, which stores recently accessed pages of memory so that cache 170 accesses of external memory 130 are reduced.

Data are communicated throughout processor 110 using a 32-bit data bus 192 and a 32-bit data bus 194 which communicate data between cache memory unit 170, segmentation unit 152, interconnected barrel shifter 184, register file 182 and ALU 180, and floating point unit 160.

Addresses are communicated between cache memory unit 170 and memory management unit 150 using a linear address bus 190.

Memory 130 stores conventional system software which controls the operation of computer system 100. During operation of computer system 100, microprocessor 110 retrieves sequences of operation codes of a computer program from memory 130 and executes the operation codes to perform tasks. One such computer program is a floating point test program 200 depicted in the flow charts of FIGS. 2 through 9. In a preferred embodiment the floating point test program 200 is written to operate using a C++ compiler, Version 3.1, which is available from Borland International, Inc., Scotts Valley, Calif.

Figure 2:
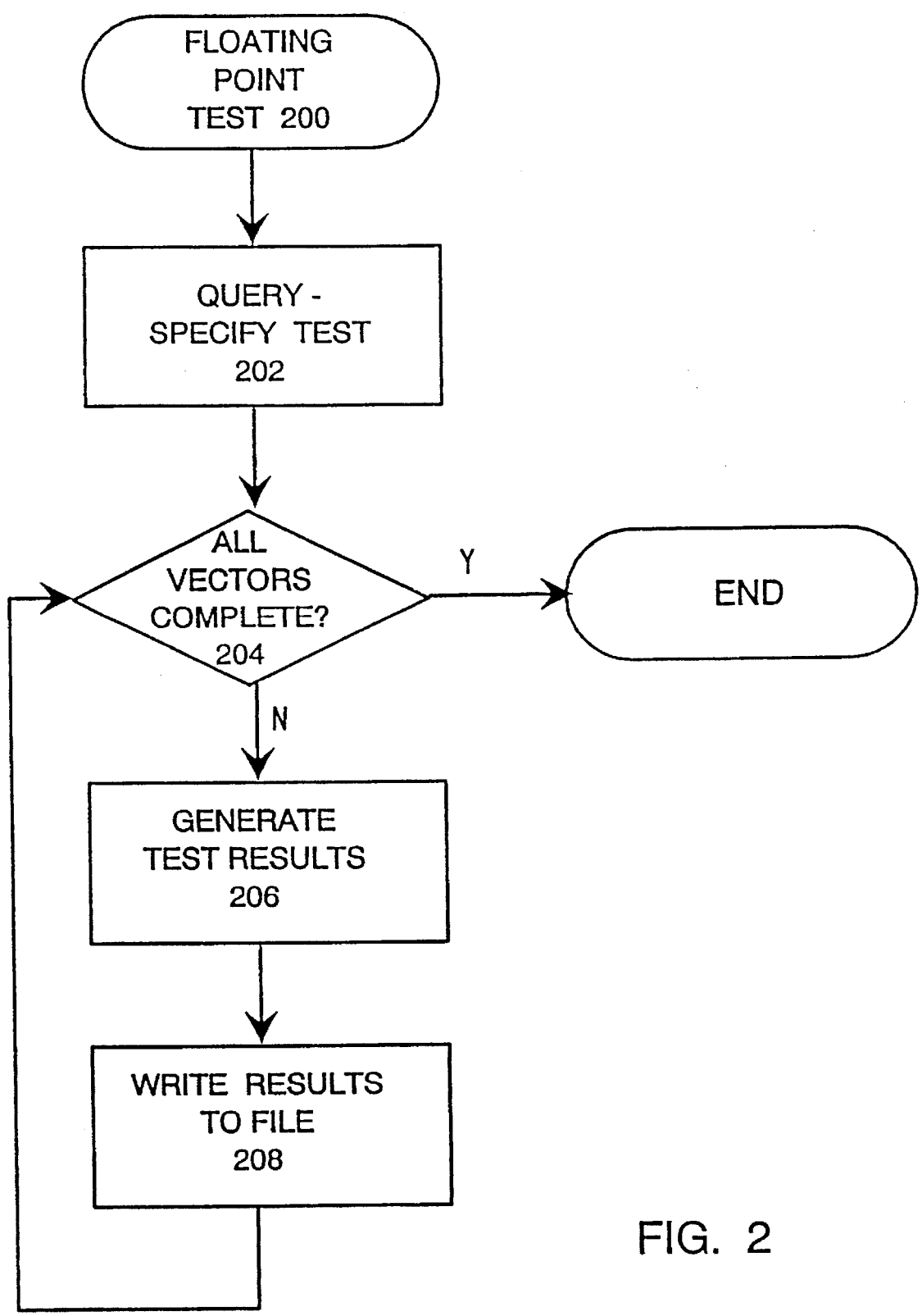
FIG. 2 is a flow chart of a computer software program controlling a computer system which operates the microprocessor of FIG. 1 to generate floating point unit test vectors.

More specifically, referring to FIG. 2, the floating point test program 200 generates a collection of random and predetermined data vectors for testing arithmetic operations of the 486 microprocessor 110, which is referred to herein as a paradigm microprocessor because it serves as an exemplary or pattern microprocessor. The 486 microprocessor 110 serves as a model or standard so that a design processor or design processor functional block may be designed and tested to emulate the paradigm in an equivalent manner.

The floating point test program 200 generates a particular set of data vectors that are associated with the arithmetic operations of a specific selected floating point instruction while the processor 110 and floating point unit 160 are configured to execute the floating point instruction using a specific selected rounding mode. Each of the various test vectors of a set of test vectors correspond to a result generated by executing the selected floating point instruction while the processor 110 is set to operate in the selected rounding mode in response to a particular input data operand or to a particular combination of input data operands in the case of multiple-operand floating point instructions. Some of the input operands are randomly selected. Other input operands are set in a predetermined manner to test floating point arithmetic responses to particular operand special test cases such as nondefined floating point numbers. Additional operands are selected from boundary operands such as positive and negative infinity and zero. Further operands are selected to reproduce conventional benchmark floating point test vectors.

In a first operation, the floating point test program 200 interactively requests input parameters that specify the instruction and rounding mode for which the vectors are generated in a query-specify test 202 module. Query-specify test 202 also selects the number of test vectors to generate. A program logic operation, all vectors complete? 204, terminates the floating point test program 200 when all vectors are processed. If the test vector set is not complete, generate test results 206 produces a single test vector. Write results to file 208 writes the vectors to a storage device such as a file on magnetic disk (not shown).

Figure 3:
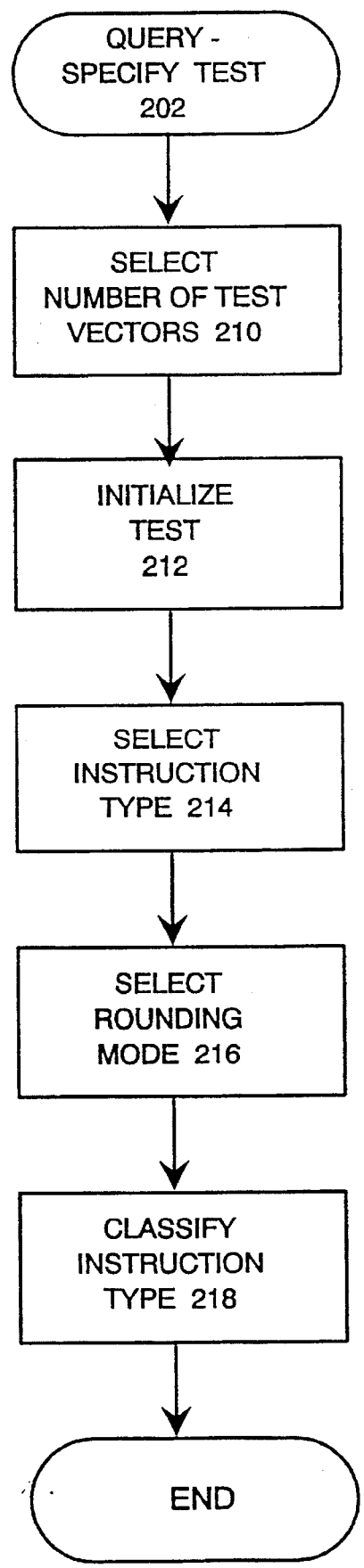
FIG. 3 is a flow chart of a segment of the computer software program of FIG. 2 which interactively selects test parameters.

The first module of the floating point test program 200 is a query-specify test module 202, which is used to interactively select the specific instruction and rounding mode that are exercised to generate a data vector set. Several blocks, which are particularly shown in FIG. 3, are included in the query-specify test module 202. The first block of the query-specify test module 202 is a select number of test vectors block 210, which is used to select the number of data vectors in the set. In one embodiment, the number of data vectors is selected by appending an argument field to the command line which activate the floating point test program 200. Any number of vectors may be specified by the operator of the floating point test program 200. If no number of vectors is specified, a default number of 100 vectors is set.

Initialize test block 212 initializes a random number generator (not shown) which is used to randomly set input operands to the floating point operation of a test. The random number generator, including initialization and generation operations, are standard library operations of the C compiler.

Initialize test block 212 also masks floating point unit (FPU) exception traps. The floating point test program 200 analyzes the arithmetic operations of the floating point unit 160 of the 486 microprocessor 110 in detail. This analysis is not limited to the numerical results of particular tests but also includes investigation of the trapping and exception functionality, setting of condition codes and other aspects of the microprocessor 110 floating point unit 160. Accordingly, the floating point test program 200 exercises the floating point unit 160 to determine its response to particular instructions and operand data values with respect to the setting of status flags and condition codes. However, it is not desired that the microprocessor 110 actively respond to the tests by engaging its exception and trapping handling operations. These emergency operations, which include hardware initialization and emergency-type program sequencing, are inappropriate for the floating point test program 200, which is used for analysis of floating point unit functionality. Initialize test block 212 masks FPU exception traps by writing the current value of the FPU control word (not shown) to a word in external memory 130, setting bits <5:0> of this word in external memory 130, then replacing the current value of the FPU control word with the value of the mask word. Bits <5:0> of the FPU control word designate exception masks for invalid operation, denormalized operand, zero divide, overflow, underflow and precision exceptions. An overflow exception is generated by the floating point unit 160 when the exponent of a numeric result is too large for the destination real format. If the exponent of a result is too small to be represented in the destination format, the floating point unit 160 sets an underflow exception. A precision exception, also called in inexact exception, occurs if the result of an operation is not exactly representable in the destination format. The precision exception occurs frequently and indicates that some accuracy has been lost during computation.

Initialize test block 212 also loads arithmetic symbols into memory, including symbols for infinity, denormalized and not-a-number (NAN) binary designations. These arithmetic symbols are ASCII-coded 80-bit hexadecimal numbers, which are used to supply test symbols for erroneous results and to test the response of the floating point unit 160 for particular special operands. The hexadecimal numbers include, in bit order from most to least significant, a sign bit, fifteen exponent bits, a 64-bit mantissa and an explicit hidden bit. Symbols include, as follows, with variable bits designated by x:

| QNaN: | 7FFF | Cxxx | xxxx | xxxx | xxxx |
| -QNaN: | FFFF | Cxxx | xxxx | xxxx | xxxx |
| SNaN: | 7FFF | Axxx | xxxx | xxxx | xxxx |
| -sNaN: | FFFF | Axxx | xxxx | xxxx | xxxx |
| infinity: | 7FFF | 8000 | 0000 | 0000 | 0000 |
| -infinity: | FFFF | 8000 | 0000 | 0000 | 0000 |
| denormal: | 0000 | 7xxx | xxxx | xxxx | xxxx |
| -denormal: | 8000 | 7xxx | xxxx | xxxx | xxxx. |

NaNs are symbolic entities that are encoded in floating point format. For some calculations, such as division by zero or subtraction of infinity from itself, no reasonable result is possible. For such calculations, the NaN is generated. There are two types of NaNs-signaling NaNs (SNaN) that signal the invalid operation exception and quiet NaNs (QNaN) that propagate through almost every arithmetic operation without signaling an exception.

An SNaN has an exponent set to the maximum value and a zero as the most significant bit of its fraction. The rest of the significant is set to any value. A floating point unit never generates an SNaN, but it does recognize an SNaN that appears as an operand. Arithmetic operations acting upon an SNaN cause an invalid-operation exception, unless the instruction is a load from stack, FXCH (floating point exchange), FCHS (floating point change sign), FUCOM (unordered compare) or FABS (floating point absolute value).

A QNaN has a one as the most significant bit of its significant. Thus a SNaN is converted to a QNaN by setting the significant most significant bit to one, leaving all other bits unchanged so that diagnostic information is retained for debugging purposes.

A denormalized number is a nonzero floating point number having an exponent with a reserved value, usually the minimum in accordance with the floating point format, and having an implicit or explicit leading significant bit that is zero. When a numeric value is very close to zero, standard normalized floating point format cannot express the value accurately. Denormalized numbers are used to implement what is called gradual underflow when an underflow condition exists in which the result of an operation has an absolute magnitude that is smaller than the smallest representable normalized number. Rather than setting the number to zero, which can result in calculation errors, a denormalized number is created having the minimum expressed exponent and a leading significant bit that is zero instead of the standard value of one. Thus a denormalized number has a lower precision than a normalized number, but maintains a nonzero value.

Select instruction type 214 interacts with the program user to request the type of instruction for which test vectors are to be generated. The floating point operations performed by the floating point unit 160 include add (FADD), subtract (FSUB and FSUBR), compare (FCMP and FCMPU), multiply (FMUL) and absolute value determination (FABS), for example.

Select rounding mode 216 interacts with the program user to select the type of rounding applied during execution of the operation. Rounding modes include round to nearest, round toward zero, round toward minus infinity, round toward plus infinity. In the round to nearest mode, the result of an instruction is rounded to the nearest representable number. In the round toward zero or truncate mode, the extra fraction bits that cannot be represented are discarded. In the round toward minus infinity mode, the result is always rounded down. In the round toward plus infinity mode, the result is always rounded up.

Classify instruction type 218 assigns instructions to predetermined classes. Some of the operands applied to the instructions are randomly selected, but are filtered so that all of the vectors generated by floating point test program 200 are meaningful. For example, if an instruction is a floating point add or subtract instruction (FADD, FSUB, FSUBR), exponents of the A and B operands should have the same relative magnitude. Adding a very large number to a very small number yields no more information than the adding of zero to the large number. Thus, instructions are grouped into four classes, a first class of instructions in which the relative size of the exponents of the two operands is significant, a second class of instructions including floating point compare instructions, a third class of instructions for which only one operand is applied, and a fourth class which includes all other instructions. In the first class, the result of the operation explicitly depends on a specific exponent range or precision.

When classify instruction type 218 is complete, query-specify test 202 is also complete. Referring again to FIG. 2, in all vectors complete? 204 the floating point test program 200 tests to determine whether the requested total number of test vectors has been generated. This is the entry point of the loop for generating multiple test vectors.

Figure 4:
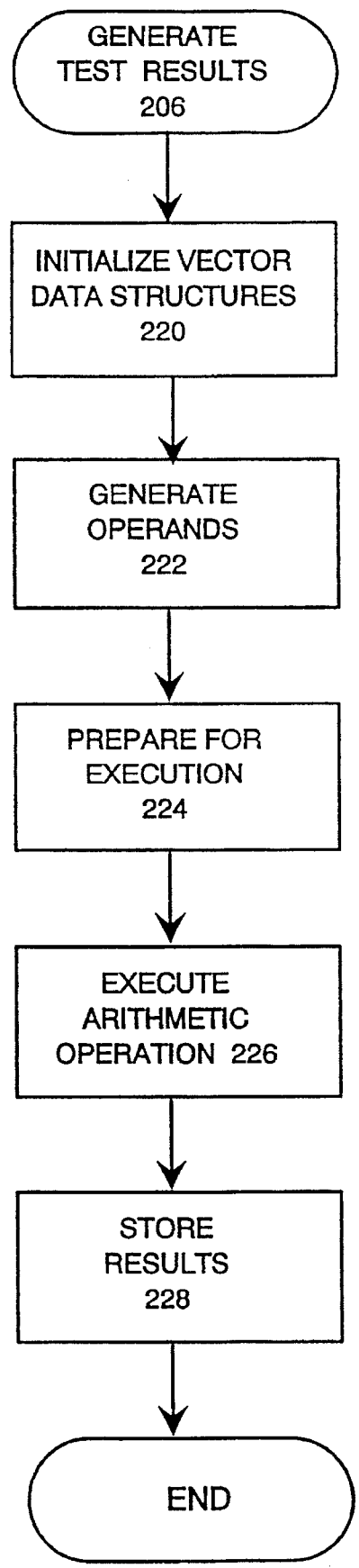
FIG. 4 is a flow chart of a segment of the computer software program of FIG. 2 which generates test results.

In generate test results 206, the multiple test vectors are generated as is shown in FIG. 4. In initialize data structures 220, data structures are initialized for each test vector. The data structures include several arrays and several output files. Arrays are in a multiple-bit ASCII-hexadecimal form. These arrays are initialized to zero and include a 5-bit condition code register (CCreg), an 8-bit exception register, 81-bit hexadecimal arrays for the A operand, B operand and result, 82-bit hexadecimal output arrays for the A operand, B operand and result and a 20-bit filename array. Also in initialize data structures 220, a file is opened that is used to receive the vectors generated by generate test results 206. This file is named to identify the particular instruction and rounding mode that are employed to generate the vectors.

Figure 5:
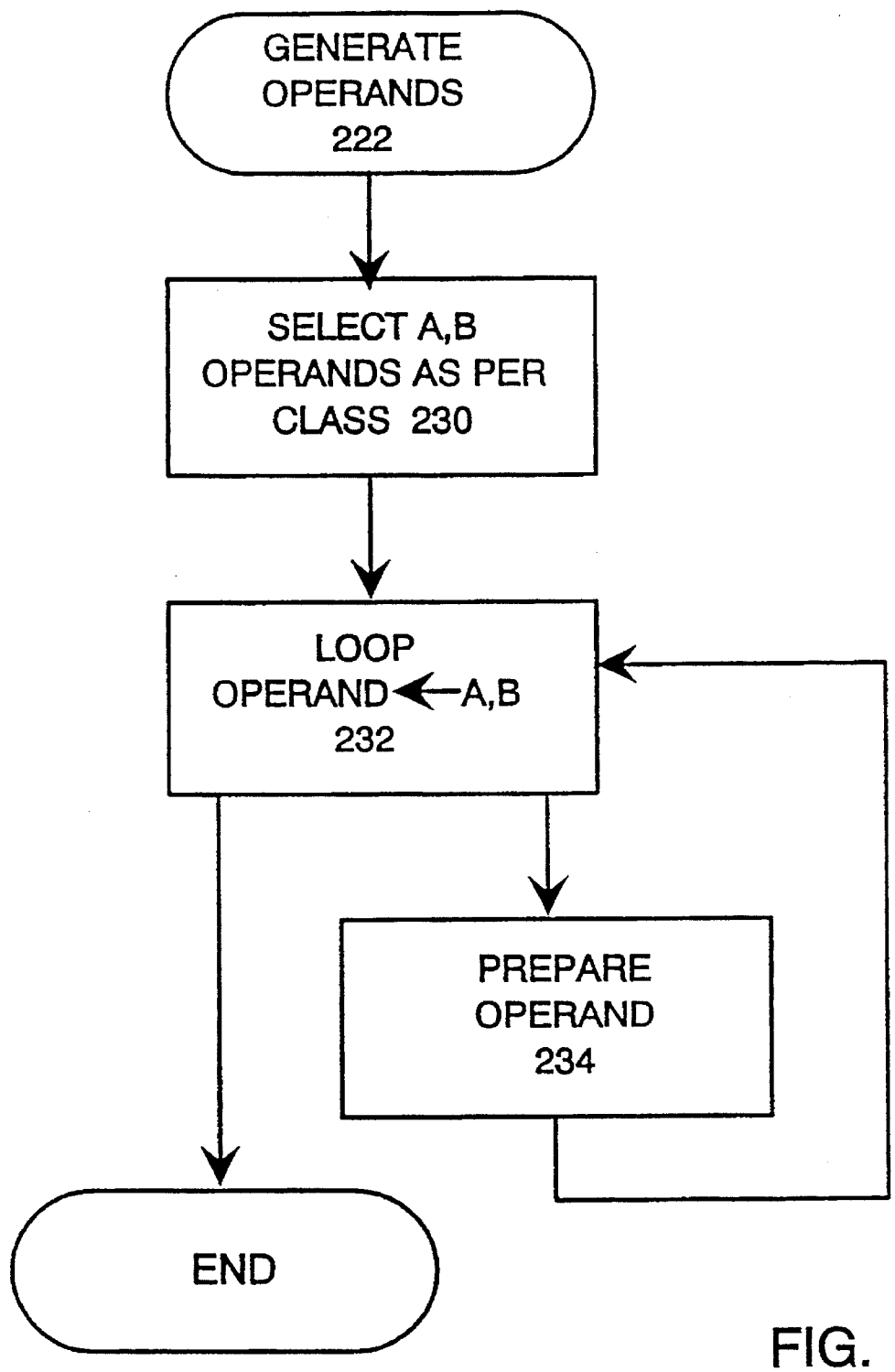
FIG. 5 is a flow chart of a segment of the computer software program segment of FIG. 4 which generates input test data for execution by the microprocessor to generate test results.

Following initialize data structures 220, generate operands 222 which is shown in more detail in FIG. 5 generates binary floating point number operands that are applied to a floating point instruction to generate the vectors. A binary floating point number is a bit string that is characterized by three components: a sign, a biased exponent and a significand. The numerical value, if any, of the number is the signed product of the significand and two raised to the power of the exponent. Select A, B operands according to class 230 generates random number operands of the type long double. Select A, B operands according to class 230 generates operands in a particular manner, depending on the class of the instruction used to generate the vectors. For the first class of instructions, a class of instructions for which the relative size of the exponents of the two operands is significant, a first random number operand is generated by randomly selecting an integer exponent in the range from 0 to the maximum possible exponent of a long double floating point number and randomly scaling this random exponent in the range of all random numbers. This exponent is randomly determined to be either positive or negative. The random floating point exponent is then raised to the power of ten to yield the first random number operand. The second random number operand of the first class of instructions is derived from the first random number operand. The second random number operand is generated by randomly selecting an integer exponent in the range from −9 to +9, raising this randomly selected exponent to the power of ten, randomly scaling the result in the range of all random numbers and multiplying the randomly scaled result by the first random number operand.

For the second class of instructions, a class which includes floating point compare instructions, select A, B operands according to class 230 generates a first random number operand by randomly selecting an integer exponent in the range from 0 to the maximum possible exponent of a long double floating point number, dividing this exponent by two, and randomly selecting this exponent to be positive or negative. The random floating point exponent is then raised to the power of ten to yield the first random number operand. The second random number operand is generated by random selection from among nine choices of operand values. Five of the choices are, respectively, ¼, ½, 1, 2 or 4 times the first random number operand. The four remaining choices are the QNaN, SNaN, infinity and denormal floating point codes.

For the third class of instructions, instructions that operate upon a single operand, select A, B operands according to class 230 generates a the random number operand by randomly selecting an integer exponent in the range from 0 to the maximum possible exponent of a long double floating point number, dividing this exponent by two, randomly selecting this exponent to be positive or negative and raising this exponent to the power of ten. The random number operand is then generated by random selection from among nine choices of operand values. Five of the choices are, respectively, ¼, ½, 1, 2 or 4 times the randomly determined operand. The four remaining choices are the QNaN, SNaN, infinity and denormal floating point codes.

For the fourth class of instructions, which includes all other instructions, select A, B operands according to class 230 generates the first and second random number operands independently of one another. For each operand, select A, B operands according to class 230 randomly selects an integer exponent in the range from 0 to the maximum possible exponent of a long double floating point number, divides this exponent by two, and randomly selects this exponent to be positive or negative. Each random floating point exponent is then raised to the power of ten to yield the random number operands.

Figure 6:
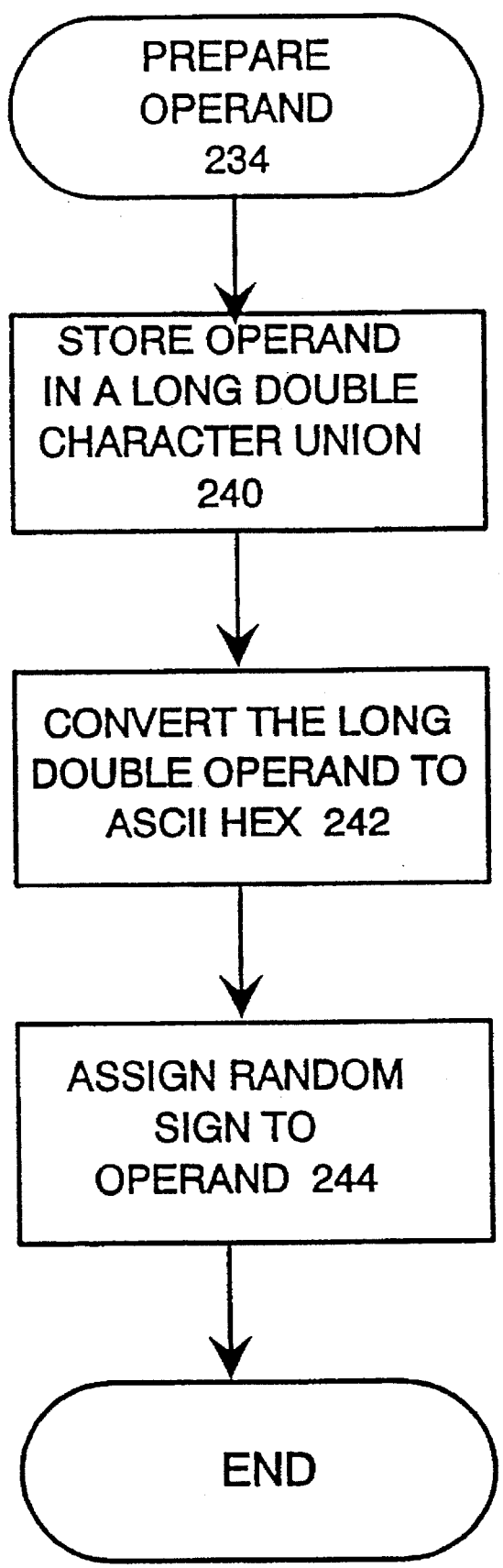
FIG. 6 is a flow chart of a segment of the computer software program segment of FIG. 5 which prepares input test data for execution by the microprocessor.
Figure 7:
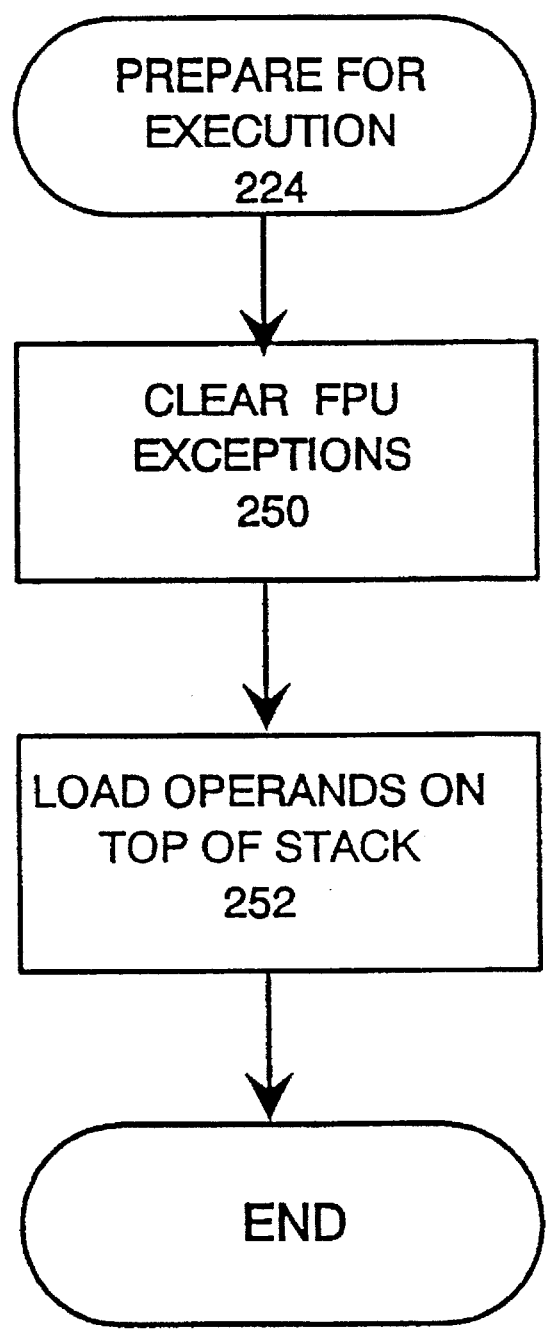
FIG. 7 is a flow chart of a segment of the computer software program segment of FIG. 4 which prepares the microprocessor for execution.
Figure 8:
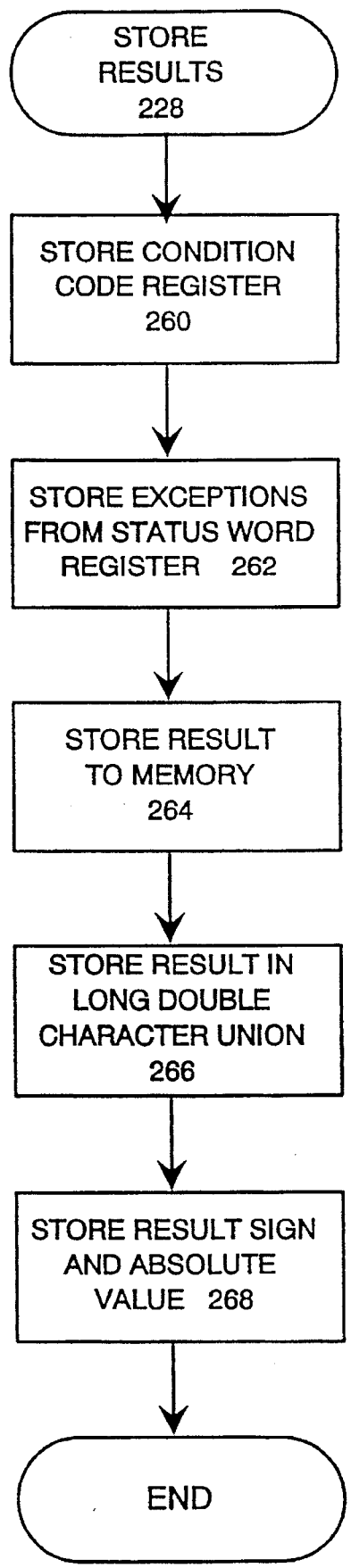
FIG. 8 is a flow chart of a segment of the computer software program segment of FIG. 4 which stores results after execution.
Figure 9:
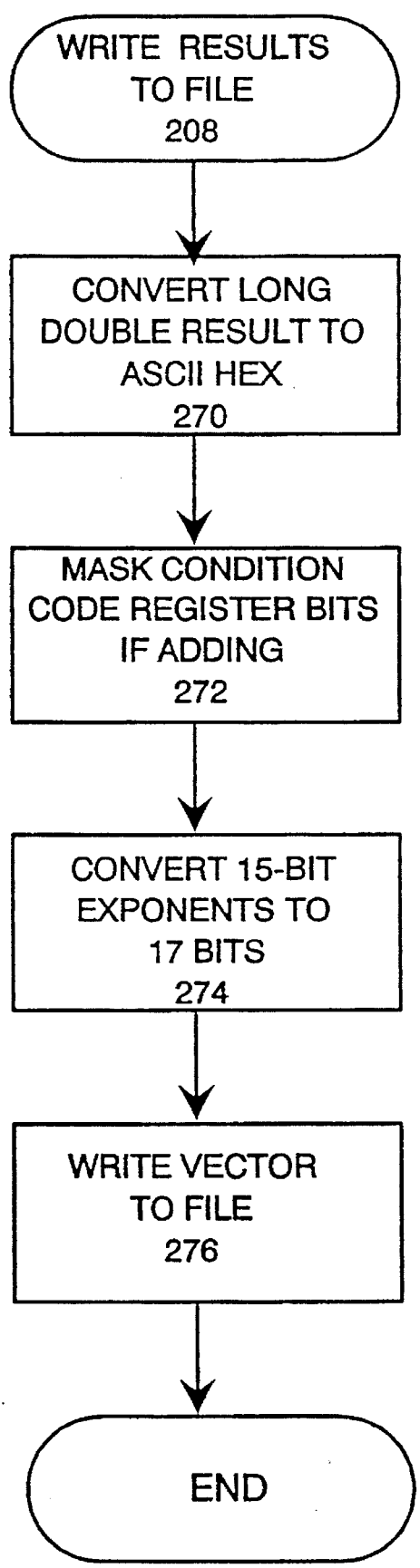
FIG. 9 is a flow chart of a segment of the computer software program of FIG. 2 which writes test results to a test vector file.

Generate operands 222 includes a loop, which is traversed twice, once for preparing each of the A and B operands in prepare operand 234 as governed by loop controller, operand <—A, B 232. The operations of prepare operand 234 are depicted in FIG. 6. In the first operation of prepare operand 234, store operand in long double character union 240 converts a random number operand to a 80-bit ASCII hexadecimal number. The operand is originally in the form of a real floating point long doubleword. An ASCII character is 8 bits in width and a hexadecimal number is four bits wide. Therefore, store operand in long double character union 240 stores two hexadecimal numbers per ASCII character. Furthermore, prepare operand 234 adds a bias of 48 to convert the operands into ASCII hexadecimal numbers. In addition, prepare operand 234 converts the operands from little endian style to a big endian style. To perform this conversion and data preparation of the operands, store operand in long double character union 240 employs a "C"-language union of a long doubleword and a 10 byte character for storing the operand in a long double character union. Conversion of the long double operand to an ASCII hexadecimal form is accomplished by convert long double operand to ASCII hex 242, which appropriately shifts bytes of the long double character union. Assign random sign to operand 244 randomly assigns either a positive or negative sign to the A operand in the first traverse of loop controller, operand <—A, B 232 and similarly assigns a sign to the B operand in the second traverse. Assign random sign to operand 244 assigns polarity by randomly selecting a plus or minus polarity and, if the polarity is minus, converting a positive number or symbol to negative.

Upon completion of generate operands 222, generate test results 206 proceeds, as shown in FIG. 4, with prepare for execution 224. Prepare for execution 224 is shown more particularly in FIG. 7. Clear FPU exceptions 250 clears exception flags, an exception status flag and a bus flag of the x486 FPU status word. Clear FPU exceptions 250 clears the exception flags and status at the hardware level of the processor. Thus initialized, particular instructions and operand data values are applied to activate the FPU hardware and the response of the hardware is analyzed with respect to the setting of exceptions, status flags and condition codes. Load operands on top of stack 252 loads the A and B operands to the top of the floating point stack. For single operands of the third class of instructions, only the A operand is loaded to the top of the stack.

Upon completion of prepare for execution 224, generate test results 206 proceeds with execute floating point arithmetic operation 226, as is shown in FIG. 4. Execute floating point arithmetic operation 226 requests execution of the requested FPU instruction using an assembly-level instruction command line. Such instruction command lines include fadd, fsub, fmul, fcompp, fabs requests, for example. Results of the instruction are logged in store results 228, which is shown more particularly in the flow diagram of FIG. 8. Store condition code register 260 uses a store status word instruction to direct the processor to write the current value of the FPU status word to a temporary memory fpuStatus. Store condition code register 260 then tests bits <8>, <9>, <10> and <14>, and records this diagnostic information, which is defined in accordance with the requested floating point operation. Store exceptions from status word register 262 also uses the store status word instruction to direct the processor to write the current value of the FPU status word to the temporary memory fpuStatus. Store exceptions from status word register 262 then tests exception flag bits <6:0>, respectively, invalid operation IE, denormalized operand DE, zero divide ZE, Overflow OE, underflow UE, precision PE, and stack fault SF. Store exceptions from status word register 262 records these flags to furnish diagnostic information, which is defined in accordance with the requested floating point operation. The result of the instruction is stored in store result to memory 264 using a store real instruction. The store real instruction copies the top of the stack, which holds the value resulting from execution of the floating point instruction, to the memory labelled result. The store real instruction stores the result, then pops the floating point stack. This result is made available for analysis in store result in long double character union 266. The sign of the result stored in store result in long double character union 266 is logged in store result sign and absolute value 268, which reads the sign of the stored result and clears the sign bit, if it was previously set.

Upon completion of store results 228, generate test results 206 is also completed and floating point test program 200, as is shown in FIG. 2, continues with write results to file 208. Write results to file 208, which is shown more particularly in FIG. 9, prepares result data for file storage in convert long double result to ASCII hex 270, which converts the long double result to an ASCII hexadecimal form. Convert long double result to ASCII hex 270 appropriately shifts bytes of the long double character union. Mask condition code register bits if adding 272 masks condition code register bits C0, C2 and C3 when the requested instruction is a floating point add instruction. These condition code bits are undefined following the fadd instruction. Convert 15-bit exponents to 17 bits 274 converts the exponent field of a floating point extended word from a 15-bit field that is provided by the x486 FPU to a 17-bit field that is furnished for the FPU of the processor that is the target of the data vectors that are supplied by floating point test program 200. Convert 15-bit exponents to 17 bits 274 adds the hexadecimal number C000 to the 15-bit exponent if the exponent is not at its maximum value, NAN, infinity or zero. For maximum, NaN and infinity results, convert 15-bit exponents to 17 bits 274 converts the exponent to hexadecimal 1FFFF. For a zero exponent, convert 15-bit exponents to 17 bits 274 maintains the exponent value of zero for the converted 17-bit exponent. Write vector to file 276 writes the data vector to the file that was opened in initialize data structures 220. Each data vector includes nine fields for storing, respectively, the condition code register, the sign of the A operand, the A operand, the sign of the B operand, the B operand, the sign of the result, the result, exception flags and a vector number. Information for identifying the tested floating point instruction and the rounding mode is expressed in the file name to which the vector is written. This file is supplied on storage medium such as a magnetic disk.

Upon completion of write results to file 208, a loop of floating point test 200 is complete. A vector counter (not shown) is updated. If all requested vectors are generated, in accordance with all vectors complete? 204, floating point test 200 is terminated. Otherwise, a set of vectors is furnished by generate test results 208.

Test vectors can be checked automatically or manually. In addition, test vectors can be applied to a simulator program, such as Verilog-XL, Version 1.6 (March 1991) from Cadence Design Systems, Inc. to test the performance of the design of a functional unit or processor. The test vectors are communicated to the simulator by various conventional wired or wireless communication techniques or transfer on removable magnetic storage media.

The generated test vectors may include input signals that are applied to a functional unit on various busses, such as operand data busses, operation code busses and status busses. In another example, the generated test vectors may include signals at a higher level such as addresses in memory or microcode for fetching instructions that are applied to a microprocessor and indirectly activate a functional unit.

The foregoing description particularly specifies many attributes of a program or system for generating floating point test vectors, including particular program instruction modules in a particular order. The program is illustratively embodied as a floating point test vector generation program. These attributes do not limit the invention scope but rather illustrate a preferred embodiment. In other embodiments, test vectors may be generated that test a design processor or design functional unit at different design levels. For example, test vectors may take the form of signals that are applied directly to a functional unit while other test vectors may be generated that are applied to a microprocessor, in the form of instruction codes, which indirectly activates the functional unit.

In another exemplary embodiment, the described system may be used to generate test vectors for functional units other than the floating point functional unit, such as an arithmetic logic unit, a shift unit, an array processor unit, a display driver that generates numbers for display upon a visual device or generates numbers to determine position for display upon the visual device. In another example, an embodiment of the system may be used to generate test vectors for testing functional equivalence of a design processor or design functional unit of a processor to processors or functional units other than 486 microprocessors. Other embodiments may be implemented using different computer languages, compilers, programming techniques or operating systems. The scope of the invention is determined by the appended claims and their equivalents.

I claim:

1. A method of generating a test vector, comprising the steps of:

providing a design functional unit which is designed to emulate a paradigm functional unit;

executing a plurality of program instructions on a processor which includes a fabricated circuit form of the paradigm functional unit, the program instructions including a plurality of instructions in a paradigm instruction set executed by the paradigm functional unit;

selecting a test instruction of the paradigm instruction set;

generating operand data which is operated upon by the paradigm functional unit executing the test instruction;

executing the test instruction operating upon the generated data;

accessing a storage stored by the fabricated circuit form of the paradigm functional unit within the processor to retrieve a test vector result; and recording a test vector result of the test instruction execution for testing the design functional unit.

2. A method as in claim 1, further comprising the step of initializing the fabricated circuit form of the paradigm functional unit prior to the test instruction executing step.

3. A method as in claim 2, wherein the step of initializing the fabricated circuit form of the paradigm functional unit includes executing a paradigm instruction set operation of clearing exception flag bits of a paradigm functional unit status word.

4. A method as in claim 2, wherein the step of initializing the fabricated circuit form of the paradigm functional unit includes executing a paradigm instruction set operation of clearing control bits of a processor condition code register.

5. A method as in claim 1, wherein the step of recording a test vector result includes the steps of:

recording sign and magnitude representations of the numerical generated operands; and recording a sign and magnitude representation of the numerical execution result.

6. A method as in claim 1, wherein the step of recording a test vector result includes the steps of:

recording a processor condition code register value subsequent to executing the test instruction;

recording a processor status word including exception flags subsequent to executing the test instruction.

7. A method as in claim 1, wherein the step of generating operand data includes the step of randomly generating the operand data.

8. A method as in claim 1, wherein the step of generating operand data includes the step of selecting operand data from among a benchmark set of operand data.

9. A method as in claim 1, wherein the step of generating operand data includes the step of selecting operand data from among a special cases set of operand data, including QNaNs and SNaNs.

10. A method as in claim 1, wherein the step of generating operand data includes the step of selecting operand data from boundary condition data, including zero value, positive infinity, negative infinity, small-difference data pairs, large-difference data pairs and values approaching zero.

11. A method as in claim 1, further comprising the steps of:

communicating the recorded test vector results to a simulator; and simulating the response of a design functional unit to the communicated test vector results.

12. A method of generating a test vector, comprising the steps of:

providing a design functional unit which is designed to emulate a paradigm functional unit;

executing a plurality of program instructions on a processor which includes a fabricated circuit form of the paradigm floating point functional unit, the program instructions including a paradigm floating point instruction set executed by the paradigm floating point functional unit;

selecting a test instruction of the paradigm floating point instruction set;

generating operand data which is operated upon by the paradigm floating point functional unit executing the test instruction;

executing the test instruction operating upon the generated data;

accessing a storage stored by the fabricated circuit form of the paradigm functional unit within the processor to retrieve a test vector result; and recording a test vector result of the test instruction execution for testing the design functional unit.

13. A method as in claim 12, further comprising the step of initializing the fabricated circuit form of the paradigm functional unit prior to the test instruction executing step.

14. A method as in claim 13, wherein the step of initializing the fabricated circuit form of the paradigm functional unit includes executing a paradigm instruction set operation of clearing exception flag bits of a paradigm functional unit status word.

15. A method as in claim 13, wherein the step of initializing the fabricated circuit form of the paradigm functional unit includes executing a paradigm instruction set operation of clearing control bits of a processor condition code register.

16. A method as in claim 12, wherein the step of recording a test vector result includes the steps of:

recording sign and magnitude representations of the numerical generated operands; and recording a sign and magnitude representation of the numerical execution result.

17. A method as in claim 12, wherein the step of recording a test vector result includes the steps of:

recording a processor condition code register value subsequent to executing the test instruction;

recording a processor status word including exception flags subsequent to executing the test instruction.

18. A method as in claim 12, wherein the step of generating operand data includes the step of randomly generating the operand data.

19. A method as in claim 12, wherein the step of generating operand data includes the step of selecting operand data from among a benchmark set of operand data.

20. A method as in claim 12, wherein the step of generating operand data includes the step of selecting operand data from among a special cases set of operand data, including QNaNs and SNaNs.

21. A method as in claim 12, wherein the step of generating operand data includes the step of selecting operand data from boundary condition data, including zero value, positive infinity, negative infinity, small-difference data pairs, large-difference data pairs and values approaching zero.

22. A method as in claim 12, further comprising the steps of:

selecting a rounding mode from among round to nearest, round toward zero, round toward minus infinity and round toward plus infinity rounding modes; and loading the selected rounding mode to a processor control word register.

23. A method as in claim 12, further comprising the steps of:

communicating the recorded test vector results to a simulator; and simulating the response of a design floating point functional unit to the communicated test vector results.

24. A computer program for generating test vectors for testing a design functional unit which is designed to emulate a paradigm functional unit, the computer program controlling a processor having a fabricated circuit form of the paradigm functional unit which executes a paradigm instruction set, the system including an arrangement of instructions formed into a plurality of modules comprising:

an interactive test selection process in which a test instruction is selected from the paradigm instruction set, the test instruction testing the design functional unit which is designed to emulate the paradigm functional unit;

an operand data generation process;

a test instruction execution process in which the fabricated circuit form of the paradigm functional unit executes the test instruction operating upon the generated operand data; and a test vector result recording process in which a test vector result of the test instruction execution is recorded.

25. A system as in claim 24, further comprising an initializing process in which a paradigm functional unit initializing instruction of the paradigm instruction set is executed.

26. A system as in claim 25, wherein the initializing process includes an instruction that clears exception flag bits of a paradigm functional unit status word.

27. A system as in claim 25, wherein the initializing process includes an instruction that clears control bits of a processor condition code register.

28. A system as in claim 24, wherein the test vector result recording process includes:

an operand sign and magnitude recording process; and an execution result sign and magnitude recording process.

29. A system as in claim 24, wherein the test vector result recording process includes:

a processor condition code register value recording process; and a processor status word and exception flags recording process.

30. A system as in claim 24, wherein the operand data generation process includes a random number generation process.

31. A system as in claim 24, wherein the operand data generation process includes a benchmark selection process.

32. A system as in claim 24, wherein the operand data generation process includes a special case selection process in which special case data includes QNaNs and SNaNs.

33. A system as in claim 24, wherein the operand data generation process includes a boundary condition selection process, in which boundary condition data includes zero value, positive infinity, negative infinity, small-difference data pairs, large-difference data pairs and values approaching zero.

34. A system as in claim 24, wherein the paradigm functional unit is a floating point processor and the paradigm instruction set is a floating point processor instruction set.

35. A test-vector generating system for generating test vectors for testing a design functional unit which is designed to emulate a paradigm functional unit, the system comprising:

a processor;

a fabricated circuit form of the paradigm functional unit coupled to the processor and operable to execute a paradigm instruction set; and a computer program system having an arrangement of instructions formed into a plurality of modules including:

an interactive test selection process in which a test instruction is selected from the paradigm instruction set, the test instruction testing the design functional unit which is designed to emulate the paradigm functional unit;

an operand data generation process;

a test instruction execution process in which the fabricated circuit form of the paradigm functional unit executes the test instruction operating upon the generated operand data; and a test vector result recording process in which a test vector result of the test instruction execution is recorded.

36. A system as in claim 35, further comprising an initializing process in which a paradigm functional unit initializing instruction of the paradigm instruction set is executed.

37. A system as in claim 36, wherein the initializing process includes an instruction that clears exception flag bits of a paradigm functional unit status word.

38. A system as in claim 36, wherein the initializing process includes an instruction that clears control bits of a processor condition code register.

39. A system as in claim 35, wherein the test vector result recording process includes:

an operand sign and magnitude recording process; and an execution result sign and magnitude recording process.

40. A system as in claim 35, wherein the test vector result recording process includes:

a processor condition code register value recording process; and a processor status word and exception flags recording process.

41. A system as in claim 35, wherein the operand data generation process includes a random generation process.

42. A system as in claim 35, wherein the operand data generation process includes a benchmark selection process.

43. A system as in claim 35, wherein the operand data generation process includes a special case selection process in which special case data includes QNaNs and SNaNs.

44. A system as in claim 35, wherein the operand data generation process includes a boundary condition selection process, in which boundary condition data includes zero value, positive infinity, negative infinity, small-difference data pairs, large-difference data pairs and values approaching zero.

45. A system as in claim 35, wherein the paradigm functional unit is a floating point processor and the paradigm instruction set is a floating point processor instruction set.

* * * * *